US009620649B1

United States Patent
Yao et al.

(10) Patent No.: US 9,620,649 B1
(45) Date of Patent: Apr. 11, 2017

(54) SEMICONDUCTOR DEVICE AND MANUFACTURING METHOD THEREOF

(71) Applicant: United Microelectronics Corp., Hsinchu (TW)

(72) Inventors: Hai-Biao Yao, Singapore (SG); Shao-Hui Wu, Singapore (SG); Chi-Fa Ku, Kaohsiung (TW); Chen-Bin Lin, Taipei (TW); Zhi-Biao Zhou, Singapore (SG)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 14/960,041

(22) Filed: Dec. 4, 2015

(30) Foreign Application Priority Data

Nov. 2, 2015 (TW) .............................. 104136012 A

(51) Int. Cl.
*H01L 29/06* (2006.01)
*H01L 29/78* (2006.01)
(Continued)

(52) U.S. Cl.
CPC .... *H01L 29/7869* (2013.01); *H01L 21/02178* (2013.01); *H01L 21/02181* (2013.01); *H01L 21/02565* (2013.01); *H01L 21/0332* (2013.01); *H01L 29/513* (2013.01); *H01L 29/517* (2013.01); *H01L 29/66969* (2013.01); *H01L 29/78606* (2013.01); *H01L 29/78696* (2013.01)

(58) Field of Classification Search
None
See application file for complete search history.

(56) References Cited

U.S. PATENT DOCUMENTS 6,346,729 B1 * 2/2002 Liang ................. H01L 29/0653
257/344
8,188,480 B2   5/2012 Itai
(Continued)

FOREIGN PATENT DOCUMENTS

JP         20060165528 A  *  6/2006  ........... H01L 29/786

OTHER PUBLICATIONS

Grenci et al, "Negative hybrid sol-gel resist as hard etching mask for pattern transfer with dry etching", Microelectronic Engineering, vol. 98, pp. 134-137 (Jul. 21, 2012).*

*Primary Examiner* — Johannes P Mondt
(74) *Attorney, Agent, or Firm* — J.C. Patents

(57) ABSTRACT

A semiconductor device and a manufacturing method thereof are provided. The semiconductor device includes an oxide semiconductor protrusion, a source, a drain, an oxide semiconductor layer, a first O-barrier layer, a gate electrode, a second O-barrier layer, and an H-barrier layer. The oxide semiconductor protrusion is disposed on an oxide substrate. The source and the drain are respectively disposed on opposite ends of the oxide semiconductor protrusion. The oxide semiconductor layer is disposed on the oxide substrate and covers the oxide semiconductor protrusion, the source, and the drain. The first O-barrier layer is disposed on the oxide semiconductor layer. The gate electrode is disposed on the first O-barrier layer and across the oxide semiconductor protrusion. The second O-barrier layer is disposed on the gate electrode. The H-barrier layer is disposed on the oxide substrate and covers the second O-barrier layer.

12 Claims, 9 Drawing Sheets

(51) Int. Cl.
*H01L 29/786* (2006.01)
*H01L 29/66* (2006.01)
*H01L 21/02* (2006.01)
*H01L 21/033* (2006.01)
*H01L 29/51* (2006.01)

(56) References Cited

U.S. PATENT DOCUMENTS

| | | |
|---|---|---|
| 8,455,869 B2 | 6/2013 | Seo et al. |
| 8,946,704 B2 | 2/2015 | Yamazaki |
| 8,956,929 B2 | 2/2015 | Egi et al. |
| 9,006,733 B2 | 4/2015 | Yamazaki |
| 9,054,200 B2 | 6/2015 | Okazaki et al. |
| 9,054,205 B2 | 6/2015 | Yamazaki et al. |
| 2006/0170019 A1* | 8/2006 | Ozaki ............... H01L 27/105 257/295 |
| 2007/0158715 A1* | 7/2007 | Hayashi ............ H01L 28/75 257/295 |
| 2010/0051892 A1* | 3/2010 | Mikawa ............ H01L 27/24 257/2 |
| 2010/0065807 A1* | 3/2010 | Takagi .............. H01L 27/101 257/5 |
| 2013/0087833 A1* | 4/2013 | Wang ............... H01L 29/66477 257/192 |
| 2013/0137213 A1* | 5/2013 | Egi .................. H01L 29/78693 438/104 |
| 2014/0225103 A1* | 8/2014 | Tezuka ............. H01L 29/66969 257/43 |
| 2014/0339544 A1 | 11/2014 | Hanaoka et al. |
| 2015/0179810 A1 | 6/2015 | Yamazaki et al. |

* cited by examiner

SEMICONDUCTOR DEVICE AND MANUFACTURING METHOD THEREOF

CROSS-REFERENCE TO RELATED APPLICATION

This application claims the priority benefit of Taiwan application serial no. 104136012, filed on Nov. 2, 2015. The entirety of the above-mentioned patent application is hereby incorporated by reference herein and made a part of this specification.

BACKGROUND OF THE INVENTION

Field of the Invention

The invention is related to a semiconductor device and a manufacturing method thereof, and more particularly, to a semiconductor device having a fin-type structure and a manufacturing method thereof.

Description of Related Art

With the rapid development in semiconductor process techniques, to increase the speed and the performance of devices, the size of the entire circuit device needs to be continuously reduced, and device integrity needs to be continuously increased. In general, in the development trend of a smaller circuit device in semiconductors, the length of the channel region in transistors is also gradually decreasing, so as to increase operating speed of the devices. However, issues such as significant leakage current and short channel effect readily occur to the transistor as a result.

To overcome the above issues, in recent years, industries have proposed a multi-gate structure in which the channel region is sandwiched via a gate, such that the entire channel region is affected by the electric field of the gate and leakage current is reduced as a result. The fin-type field effect transistor is a common transistor having a multi-gate structure. FIG. 1 is a three-dimensional schematic of a known fin-type field effect transistor. Referring to FIG. 1, in a fin-type field effect transistor 10, an oxide substrate 100 has an oxide semiconductor protrusion 102 thereon, a source 104a and a drain 104b are respectively disposed on two opposite ends of the oxide semiconductor protrusion 102, a gate insulating layer 106 is disposed on the oxide substrate 100 and covers the oxide semiconductor protrusion 102, the source 104a, and the drain 104b, and a gate electrode 108 is disposed on the gate insulating layer 106 and across the oxide semiconductor protrusion 102.

However, since the material of the gate electrode is generally a metal material, when the oxide semiconductor material in the fin-type field effect transistor is to be repaired via an oxygen annealing treatment in a subsequent process or the fin-type field effect transistor is in an oxygen environment, oxidation phenomenon often occurs to the gate electrode in contact with oxygen, thus affecting device performance.

SUMMARY OF THE INVENTION

The invention provides a semiconductor device having an O-barrier layer disposed on a gate electrode.

The invention further provides a manufacturing method of a semiconductor device in which an O-barrier layer is formed on a gate electrode.

The semiconductor device of the invention includes an oxide semiconductor protrusion, a source, a drain, an oxide semiconductor layer, a first O-barrier layer, a gate electrode, a second O-barrier layer, and an H-barrier layer. The oxide semiconductor protrusion is disposed on an oxide substrate. The source and the drain are respectively disposed on opposite ends of the oxide semiconductor protrusion. The oxide semiconductor layer is disposed on the oxide substrate and covers the oxide semiconductor protrusion, the source, and the drain. The first O-barrier layer is disposed on the oxide semiconductor layer. The gate electrode is disposed on the first O-barrier layer and across the oxide semiconductor protrusion. The second O-barrier layer is disposed on the gate electrode. The H-barrier layer is disposed on the oxide substrate and covers the second O-barrier layer.

In an embodiment of the semiconductor device of the invention, the material of the first O-barrier layer is, for instance, hafnium oxide.

In an embodiment of the semiconductor device of the invention, the material of the second O-barrier layer is, for instance, hafnium oxide.

In an embodiment of the semiconductor device of the invention, a hard mask layer is further disposed on the top surface of the gate electrode.

In an embodiment of the semiconductor device of the invention, spacers are further disposed on the first O-barrier layer and located on the sidewalls of the gate electrode.

In an embodiment of the semiconductor device of the invention, the source and the drain are only located on the top surface of the oxide semiconductor protrusion.

In an embodiment of the semiconductor device of the invention, the source and the drain are located on the top surface of the oxide semiconductor protrusion and extended downward to cover the sidewalls of the oxide semiconductor protrusion.

In an embodiment of the semiconductor device of the invention, the material of the H-barrier layer is, for instance, aluminum oxide.

In an embodiment of the semiconductor device of the invention, the oxide semiconductor protrusion includes a first oxide semiconductor layer and a second oxide semiconductor layer stacked on each other.

In an embodiment of the semiconductor device of the invention, the second O-barrier layer is only located on the top surface of the gate electrode.

In an embodiment of the semiconductor device of the invention, the second O-barrier layer is located on the top surface and the sidewalls of the gate electrode.

The manufacturing method of a semiconductor device of the invention includes the following steps: forming an oxide semiconductor protrusion on an oxide substrate; respectively forming a source and a drain on two opposite ends of the oxide semiconductor protrusion; forming an oxide semiconductor layer on the oxide substrate, wherein the oxide semiconductor layer covers the oxide semiconductor protrusion, the source, and the drain; forming a first O-barrier layer on the oxide semiconductor layer; forming a gate electrode on the first O-barrier layer, wherein the gate electrode is across the oxide semiconductor protrusion; forming a second O-barrier layer on the gate electrode; and forming an H-barrier layer on the oxide substrate.

In an embodiment of the manufacturing method of a semiconductor device of the invention, the material of the first O-barrier layer is, for instance, hafnium oxide.

In an embodiment of the manufacturing method of a semiconductor device of the invention, the material of the second O-barrier layer is, for instance, hafnium oxide.

In an embodiment of the manufacturing method of a semiconductor device of the invention, a hard mask layer is further formed on the top surface of the gate electrode.

In an embodiment of the manufacturing method of a semiconductor device of the invention, spacers are further formed on the first O-barrier layer, wherein the spacers are located on the sidewalls of the gate electrode.

In an embodiment of the manufacturing method of a semiconductor device of the invention, the source and the drain are only located on the top surface of the oxide semiconductor protrusion.

In an embodiment of the manufacturing method of a semiconductor device of the invention, the source and the drain are located on the top surface of the oxide semiconductor protrusion and extended downward to cover the sidewalls of the oxide semiconductor protrusion.

In an embodiment of the manufacturing method of a semiconductor device of the invention, the second O-barrier layer is only located on the top surface of the gate electrode.

In an embodiment of the manufacturing method of a semiconductor device of the invention, the second O-barrier layer is located on the top surface and the sidewalls of the gate electrode.

Based on the above, in the semiconductor device of an embodiment of the invention, the O-barrier layer is formed on the gate electrode, and therefore when the oxide semiconductor layer in the semiconductor device is to be repaired via an oxygen annealing treatment in a subsequent process or the semiconductor device is in an oxygen environment, oxidation phenomenon generated by contact between oxygen and the gate electrode can be prevented.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
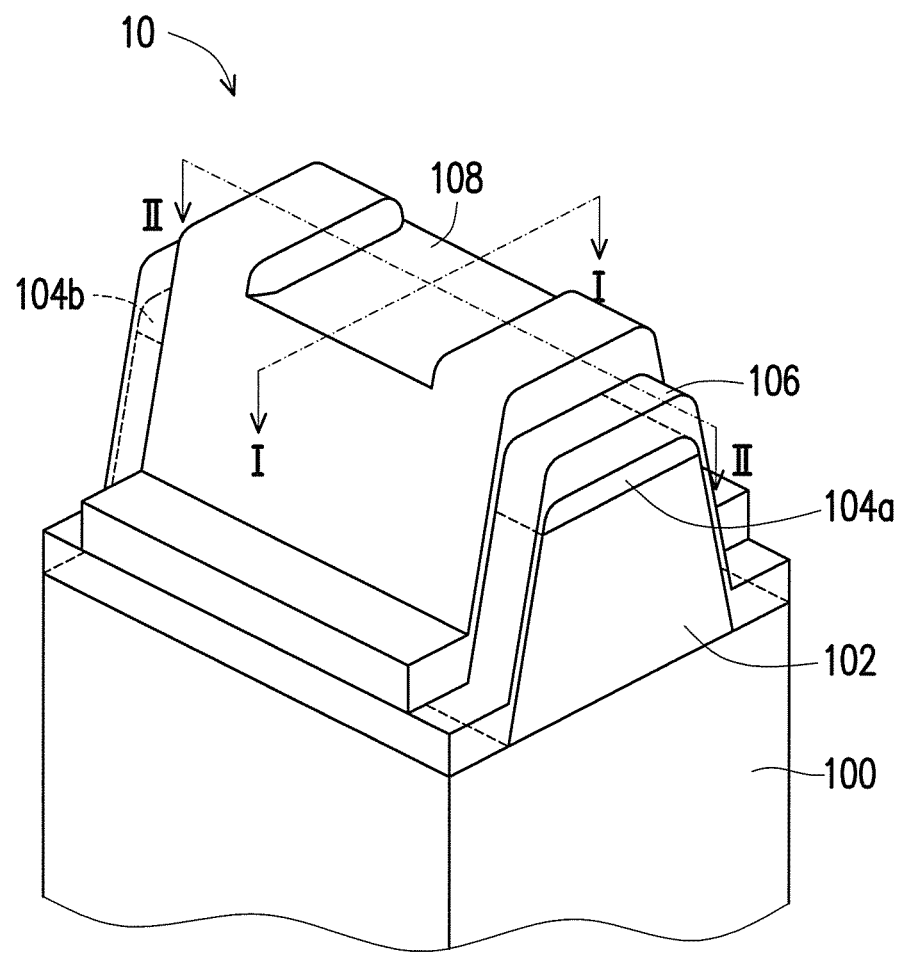
FIG. 1 is a three-dimensional schematic of a known fin-type field effect transistor.

FIG. 2A to FIG. 2D are cross-sectional schematics of the manufacturing process of a fin-type field effect transistor of the first embodiment of the invention shown with reference to line I-I in FIG. 1. FIG. 3A to FIG. 3D are cross-sectional schematics of the manufacturing process of the fin-type field effect transistor of the first embodiment of the invention shown with reference to line II-II in FIG. 1. First, referring to both FIG. 2A and FIG. 3A, an oxide semiconductor protrusion 202 is formed on an oxide substrate 200, and a source/drain material layer 204 is formed on the oxide semiconductor protrusion 202. In an embodiment, the oxide substrate 200 is, for instance, formed by stacking a plurality of oxide layers on a silicon substrate, and the oxide layers can include an aluminum oxide layer, a silicon oxide layer, a hafnium oxide layer, and a silicon oxide layer from the silicon substrate up in order, but the invention is not limited thereto. In the present embodiment, the oxide semiconductor protrusion 202 includes an oxide semiconductor layer 202a and an oxide semiconductor layer 202b stacked on each other. The material of each of the oxide semiconductor layer 202a and the oxide semiconductor layer 202b can be an oxide material containing In and Zn and selected from one of the group consisting of Al, Ti, Ga, Y, Zr, Sn, La, Ce, and Hf. Moreover, in another embodiment, the oxide semiconductor protrusion 202 can also be a single-layer structure. The material of the source/drain material layer 204 is, for instance, a metal. In the present embodiment, the material of the source/drain material layer 204 is tungsten.

In the present embodiment, the oxide semiconductor layer 202a, the oxide semiconductor layer 202b, and the source/drain material layer 204 are, for instance, comprehensively formed on the oxide substrate 200 in order via a method of deposition. Then, a patterning process is performed on the oxide semiconductor layer 202a, the oxide semiconductor layer 202b, and the source/drain material layer 204 to form the oxide semiconductor protrusion 202 and the source/drain material layer 204 located thereon.

Figure 2A:
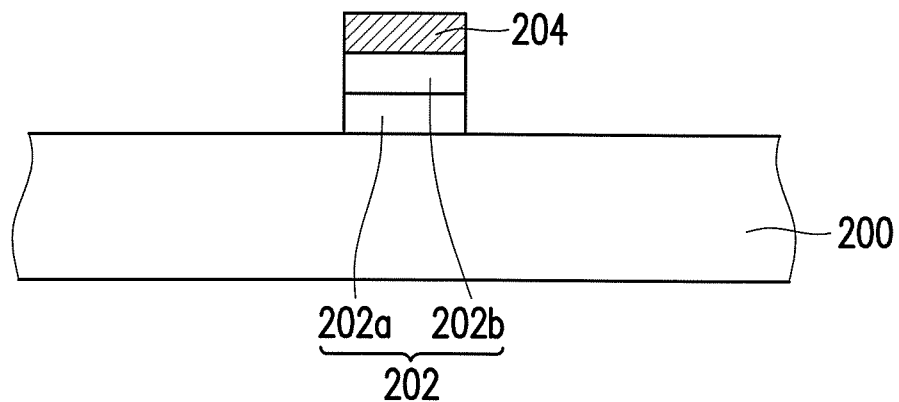
FIG. 2A to FIG. 2D are cross-sectional schematics of the manufacturing process of a fin-type field effect transistor of the first embodiment of the invention shown with reference to line I-I in FIG. 1.
Figure 2B:
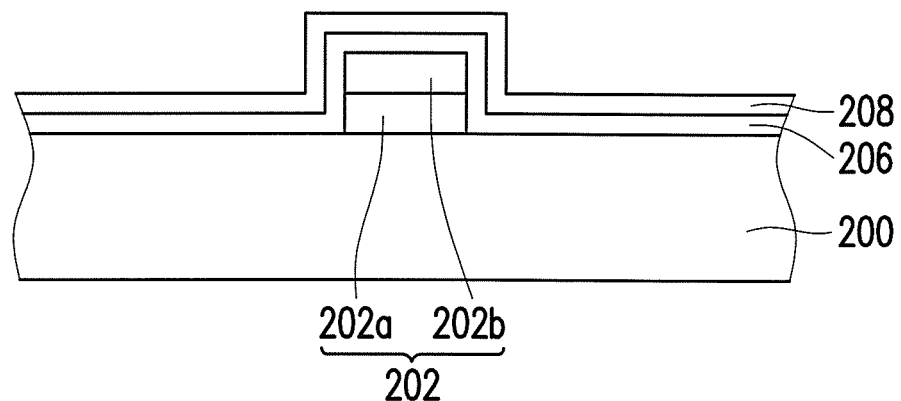
Figure 3A:
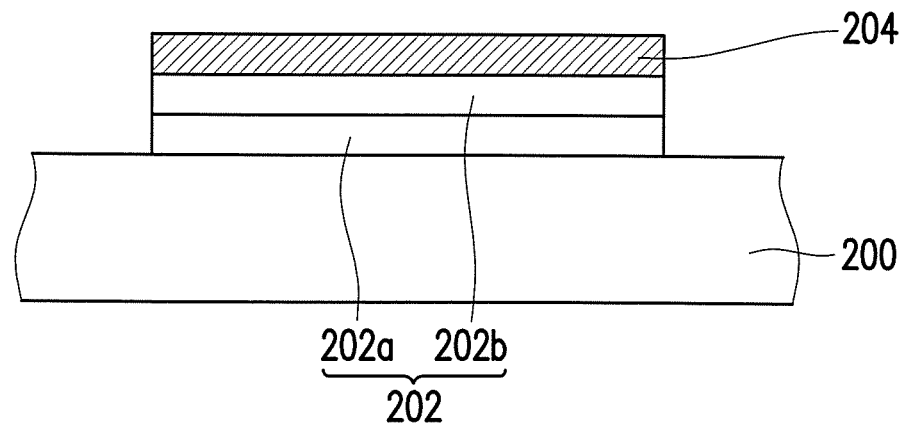
FIG. 3A to FIG. 3D are cross-sectional schematics of the manufacturing process of the fin-type field effect transistor of the first embodiment of the invention shown with reference to line II-II in FIG. 1.
Figure 3B:
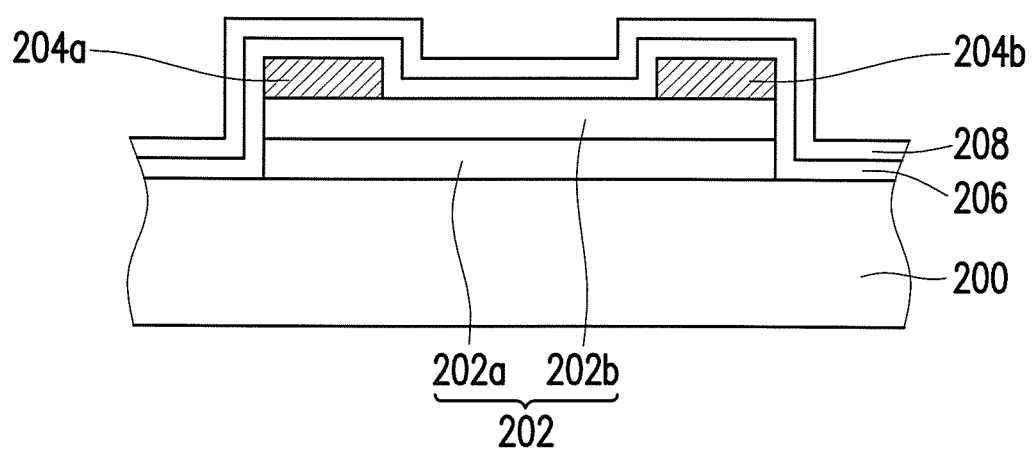

Then, referring to both FIG. 2B and FIG. 3B, a patterning process is performed to remove a portion of the source/drain material layer 204, so as to respectively form a source 204a and a drain 204b on two opposite ends of the oxide semiconductor protrusion 202. The portion of the oxide semiconductor protrusion 202 located between the source 204a and the drain 204b is used as a channel region of the fin-type field effect transistor. Then, an oxide semiconductor layer 206 is conformally formed on the oxide substrate 200 to cover the oxide semiconductor protrusion 200, the source 204a, and the drain 204b. The material of the oxide semiconductor layer 206 is, for instance, an oxide material containing In and Zn and selected from one of the group consisting of Al, Ti, Ga, Y, Zr, Sn, La, Ce, and Hf. Then, an O-barrier layer 208 is conformally formed on the oxide semiconductor layer 206. The material of the O-barrier layer 208 is, for instance, hafnium oxide, and is, for instance, formed on the oxide semiconductor layer 206 via a method of deposition.

Figure 2C:
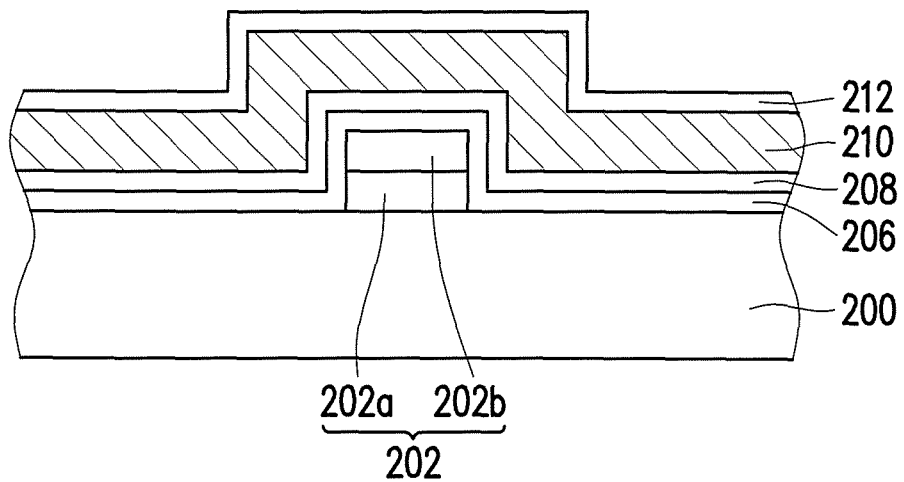
Figure 3C:
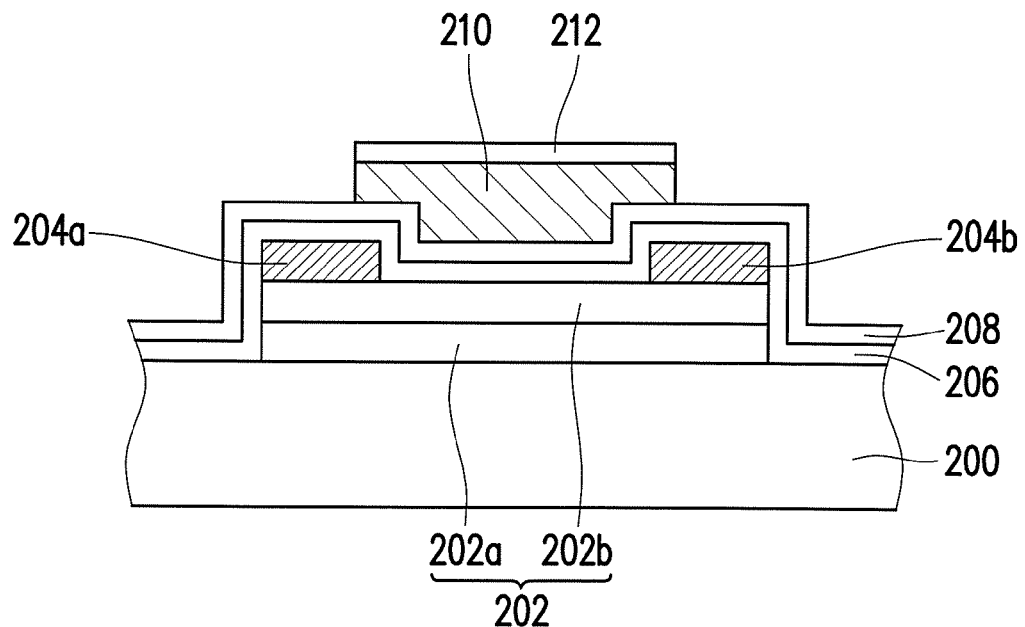

Then, referring to both FIG. 2C and FIG. 3C, a gate electrode material layer (not shown) is formed on the O-barrier layer 208. The gate electrode material layer is, for instance, a composite layer formed by a tungsten layer and a titanium nitride layer, wherein the tungsten layer and the titanium nitride layer are, for instance, formed on the O-barrier layer 208 in order via a method of deposition. However, the invention is not limited thereto. In other embodiments, the gate electrode material layer can also be other types of composite layer or a single film layer. Then, another O-barrier material layer (not shown) is conformally formed on the gate electrode material layer. The material of the O-barrier material layer is, for instance, hafnium oxide, and is, for instance, formed on the gate electrode material layer via a method of deposition. Then, a patterning process is performed to remove a portion of the gate electrode material layer and the O-barrier material layer above the gate electrode material layer so as to form a gate electrode 210 across the oxide semiconductor protrusion 202 and an O-barrier layer 212 located above the gate electrode 210. In another embodiment, during or after the patterning process, a portion of the oxide semiconductor layer 206 and the O-barrier layer 208 can also be removed such that the oxide semiconductor layer 206 and the O-barrier layer 208 only remain below the gate electrode 210.

Figure 2D:
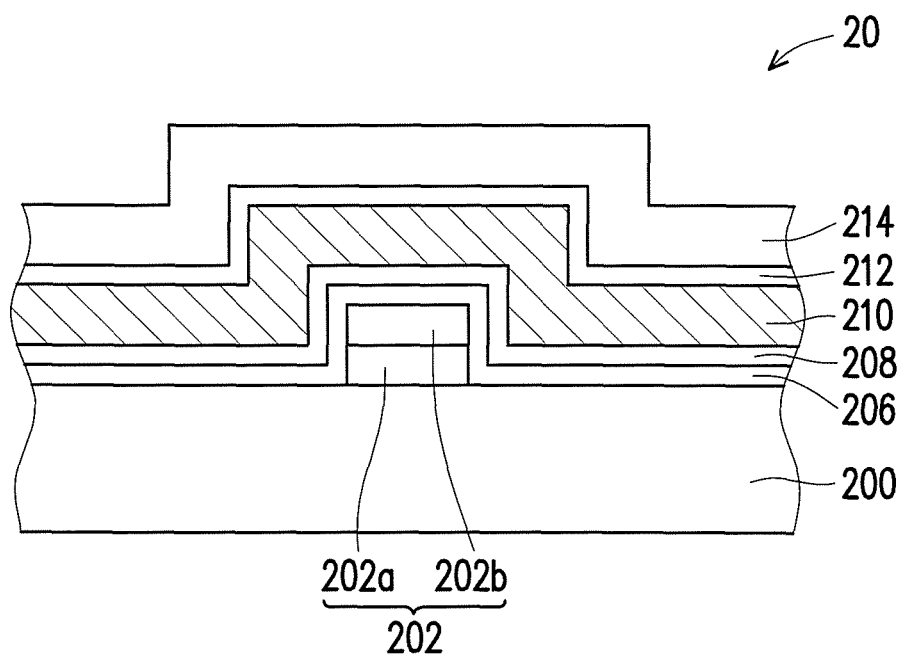
Figure 3D:
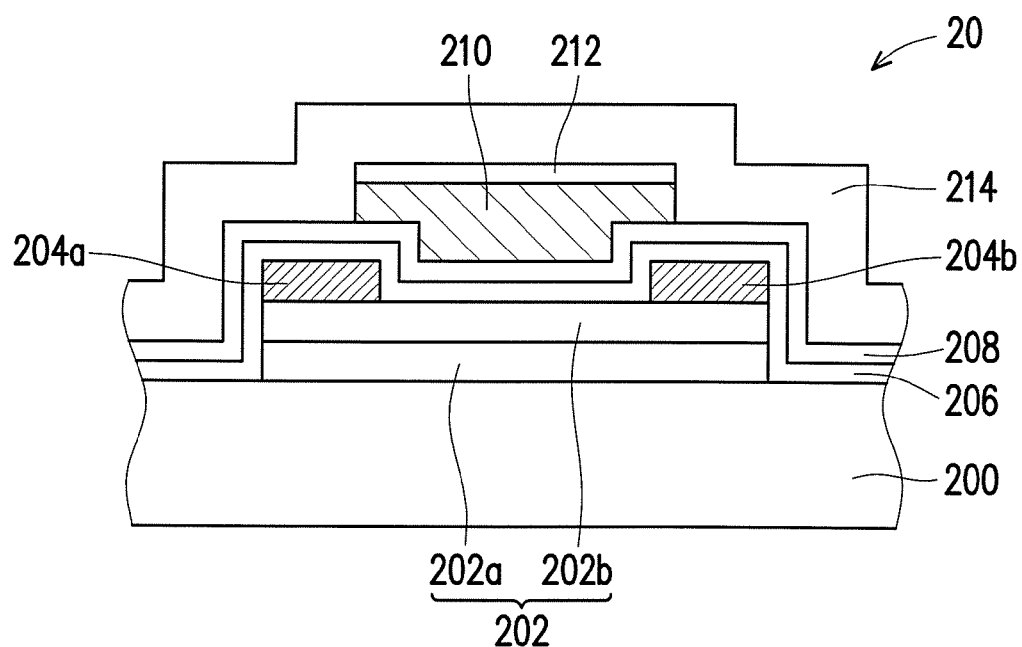

Then, referring to both FIG. 2D and FIG. 3D, an H-barrier layer 214 is conformally formed on the oxide substrate 200 to complete a fin-type field effect transistor 20 of the present embodiment. The H-barrier layer 214 covers the oxide substrate 200 and the film layers located on the oxide substrate 200. The material of the H-barrier layer 214 is, for instance, aluminum oxide, and is, for instance, formed on the oxide substrate 200 via a method of deposition. The H-barrier layer 214 can block outside hydrogen and water vapor from entering the fin-type field effect transistor 20.

In the fin-type field effect transistor 20 of the present embodiment, by disposing the O-barrier layer 208 between the gate electrode 210 and the oxide semiconductor layer 206, not only can the O-barrier layer 208 be used as a gate insulating layer in the fin-type field effect transistor 20, when the oxide semiconductor layer in the fin-type field effect transistor 20 is to be repaired via an oxygen annealing treatment in a subsequent process or the fin-type field effect transistor 20 is in an oxygen environment, oxygen injected into the oxide semiconductor layer can be effectively kept in the oxide semiconductor layer and not escape, thus preventing contact between escaped oxygen and the gate electrode 210 and the resulting gate electrode oxidation. Moreover, the O-barrier layer 212 is disposed on the gate electrode 210, and oxidation phenomenon generated by contact between outside oxygen and the gate electrode 210 can also be prevented when an oxygen annealing treatment is performed or in an oxygen environment.

Figure 4A:
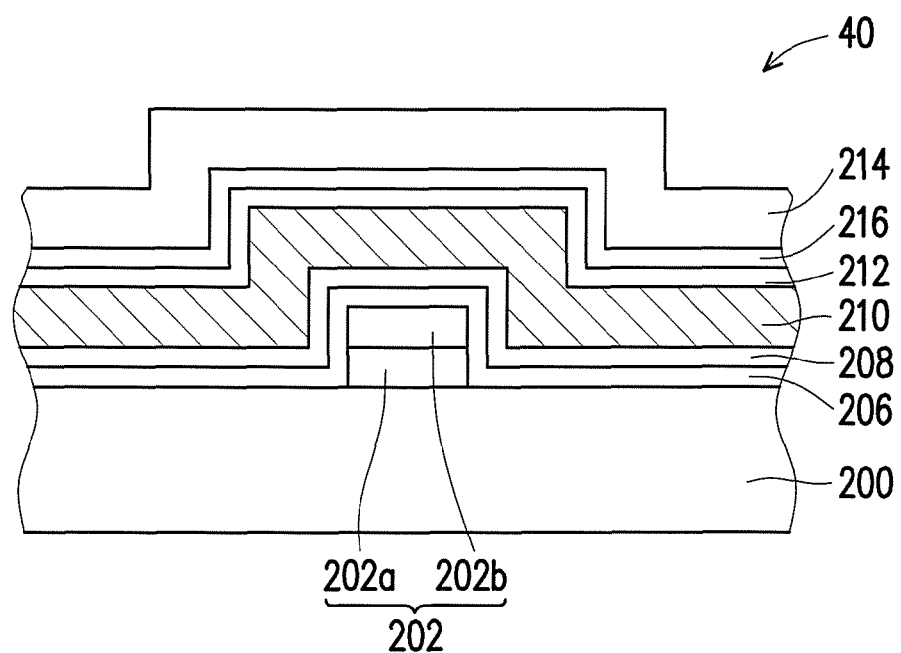
FIG. 4A is a cross-sectional schematic of the fin-type field effect transistor of the second embodiment of the invention shown with reference to line I-I in FIG. 1.
Figure 4B:
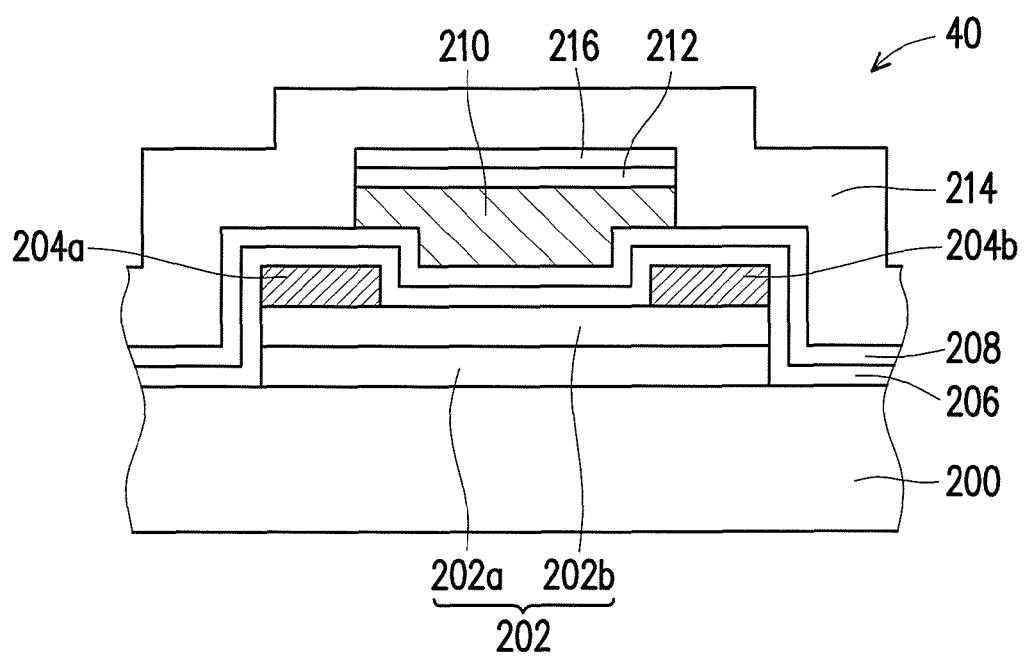
FIG. 4B is a cross-sectional schematic of the fin-type field effect transistor of the second embodiment of the invention shown with reference to line II-II in FIG. 1.

FIG. 4A is a cross-sectional schematic of the fin-type field effect transistor of the second embodiment of the invention shown with reference to line I-I in FIG. 1. FIG. 4B is a cross-sectional schematic of the fin-type field effect transistor of the second embodiment of the invention shown with reference to line II-II in FIG. 1. Referring to both FIG. 4A and FIG. 4B, in the present embodiment, the difference between a fin-type field effect transistor 40 and the fin-type field effect transistor 20 is: in the fin-type field effect transistor 40, a hard mask layer 216 is disposed above the O-barrier layer 212. The material of the hard mask layer 216 is, for instance, silicon oxide, silicon nitride, silicon oxynitride, or titanium nitride. The hard mask layer 216 is, for instance, formed on the O-barrier layer 212 via a method of deposition. Specifically, after the O-barrier material layer is formed on the gate electrode material layer as shown in FIG. 2C and FIG. 3C, the hard mask layer 216 is formed on the O-barrier material layer, and then a subsequently desired patterning process is performed.

Figure 5A:
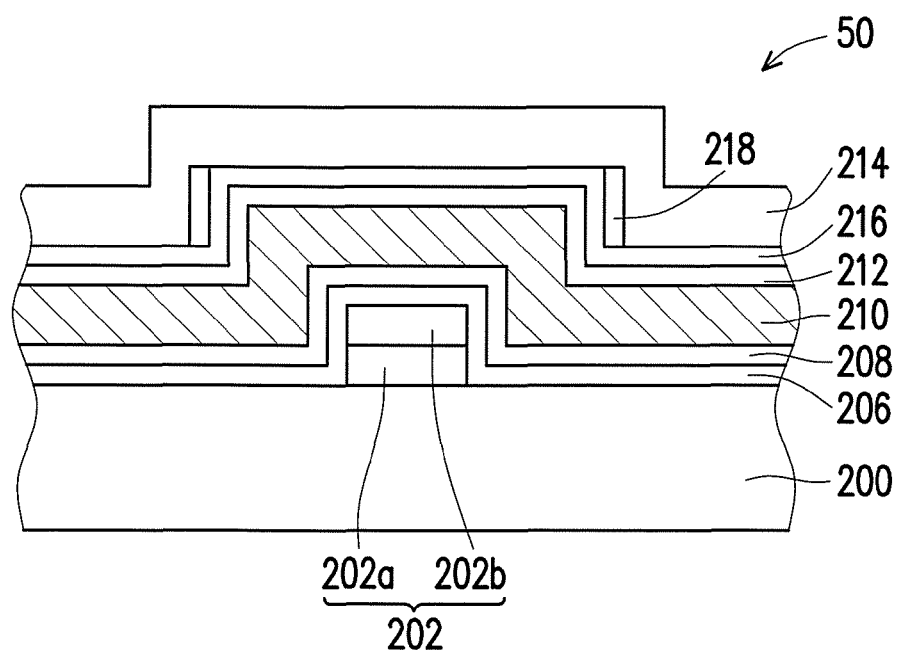
FIG. 5A is a cross-sectional schematic of the fin-type field effect transistor of the third embodiment of the invention shown with reference to line I-I in FIG. 1.
Figure 5B:
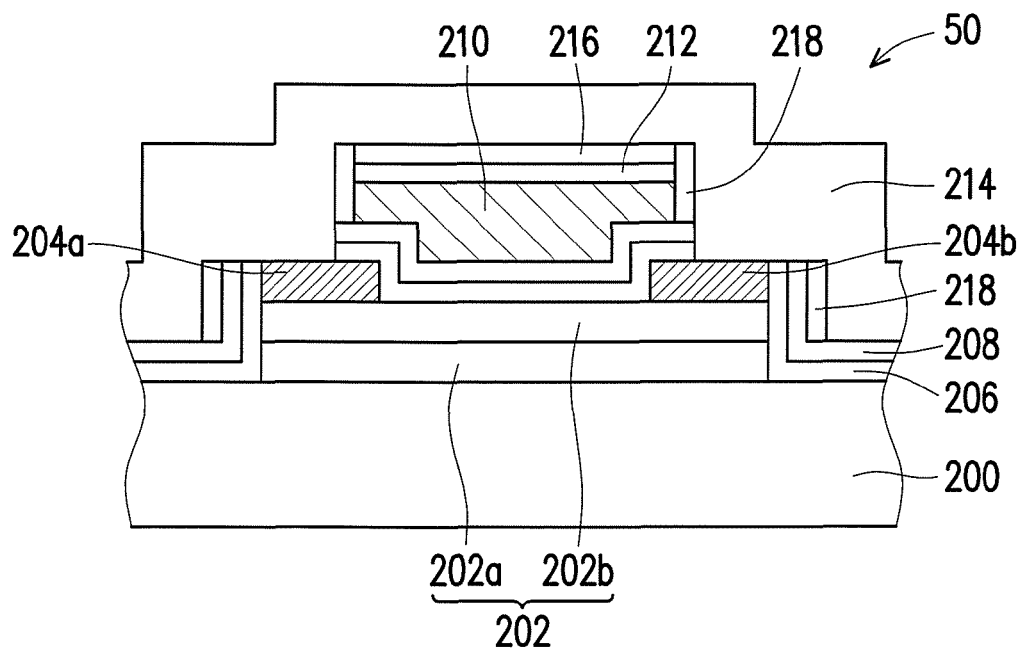
FIG. 5B is a cross-sectional schematic of the fin-type field effect transistor of the third embodiment of the invention shown with reference to line II-II in FIG. 1.

FIG. 5A is a cross-sectional schematic of the fin-type field effect transistor of the third embodiment of the invention shown with reference to line I-I in FIG. 1. FIG. 5B is a cross-sectional schematic of the fin-type field effect transistor of the third embodiment of the invention shown with reference to line II-II in FIG. 1. Referring to both FIG. 5A and FIG. 5B, in the present embodiment, the difference between a fin-type field effect transistor 50 and the fin-type field effect transistor 40 is: spacers 218 are disposed on the sidewalls of the gate electrode 210, and a portion of the source 204a and a portion of the drain 204b are exposed. The material of the spacers 218 is, for instance, silicon oxide, silicon nitride, silicon oxynitride, or aluminum oxide. The forming method of the spacers 218 includes, for instance, first conformally forming a spacer material layer after the hard mask layer 216 is formed as shown in FIG. 4A and FIG. 4B, and then performing an anisotropic etching process to remove a portion of the spacer material layer. It should be mentioned that, after the anisotropic etching process is performed, in addition to forming the spacers 218 on the sidewalls of the gate electrode 210, the spacers 218 are also formed adjacent to the sidewalls of the source 204a, the drain 204b, and the oxide semiconductor protrusion 202. Moreover, after the spacers 218 are forming, an etching process is performed by using the spacers 218 as a mask to remove a portion of the oxide semiconductor layer 206 and the O-barrier layer 208, so as to expose a portion of the source 204a and a portion of the drain 204b.

It should also be mentioned that, in an embodiment (such as the second embodiment) in which the spacers 218 are not formed, an etching process can also be performed by using the hard mask layer 216 as the mask to remove a portion of the oxide semiconductor layer 206 and the O-barrier layer 208, so as to expose a portion of the source 204a and a portion of the drain 204b.

Figure 6:
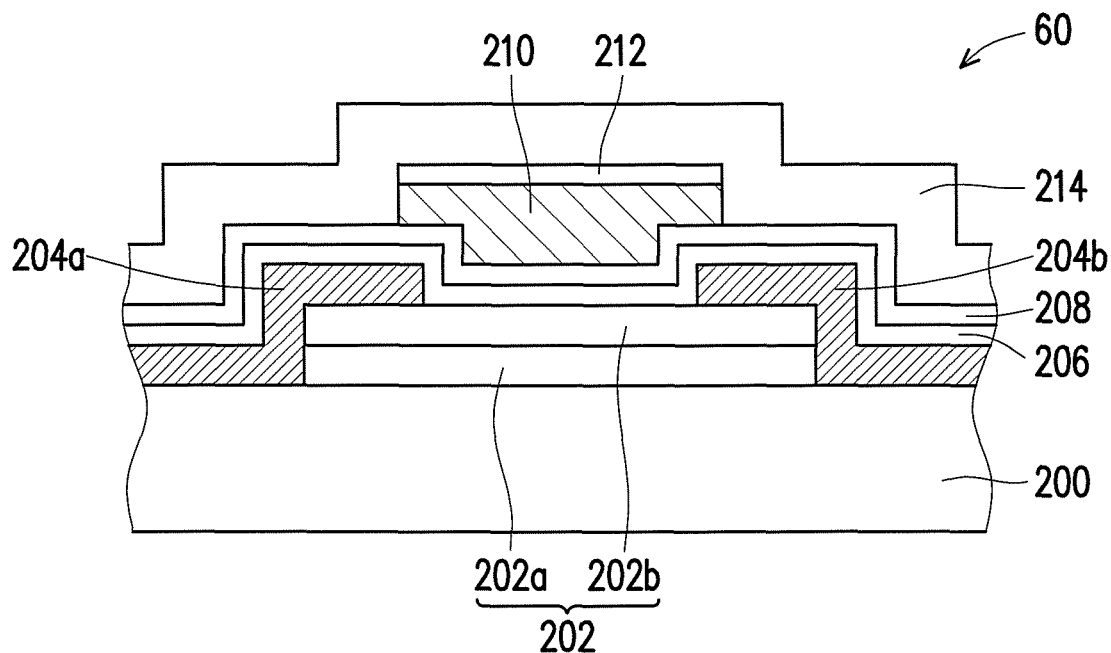
FIG. 6 is a cross-sectional schematic of the fin-type field effect transistor of the fourth embodiment of the invention shown with reference to line II-II in FIG. 1.

FIG. 6 is a cross-sectional schematic of the fin-type field effect transistor of the fourth embodiment of the invention shown with reference to line II-II in FIG. 1. Referring to FIG. 6, the difference between a fin-type field effect transistor 60 and the fin-type field effect transistor 20 is: in the fin-type field effect transistor 60, in addition to being disposed on the top surface of the oxide semiconductor protrusion 202, the source 204a and the drain 204b are further extended downward to cover the sidewalls of the oxide semiconductor protrusion 202. In the present embodiment, the forming method of the source 204a and the drain 204b includes, for instance, forming the source 204a and the drain 204b via a method of deposition on the top surface and the sidewalls of the oxide semiconductor protrusion 202 after the oxide semiconductor protrusion 202 is formed. Of course, in other embodiments (such as the second embodiment or the third embodiment), the source 204a and a portion of the drain 204b can also be extended downward to cover the sidewalls of the oxide semiconductor protrusion 202.

In each of the above embodiments, the O-barrier layer 212 is only located on the top surface of the gate electrode 210, but the invention is not limited thereto. In other embodiments, in addition to being located on the top surface of the gate electrode 210, the O-barrier layer 212 can also be located on the sidewalls of the gate electrode 210.

Figure 7:
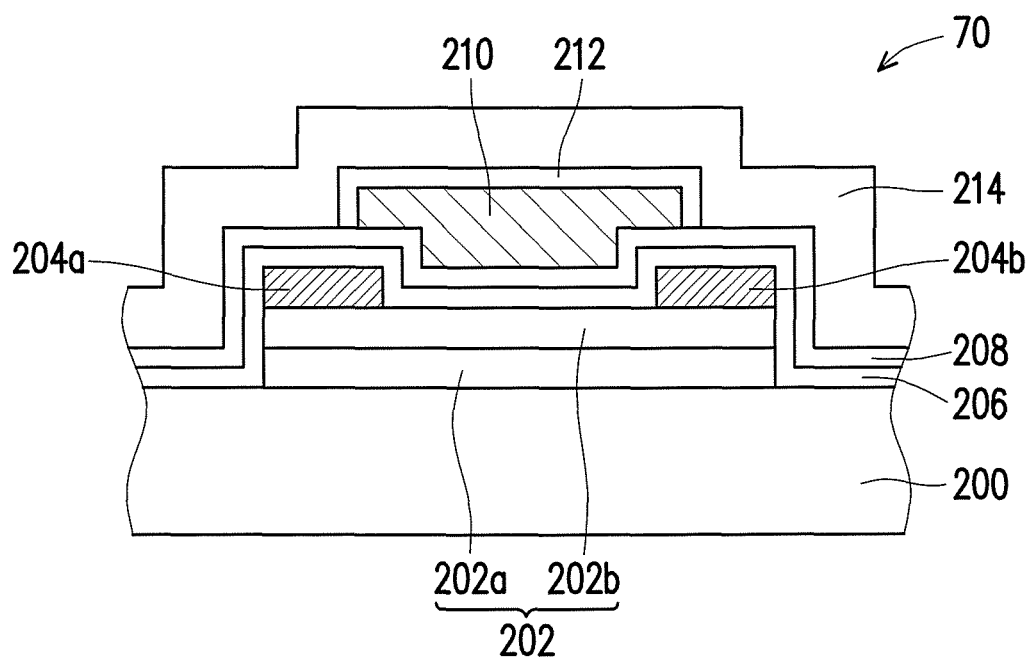
FIG. 7 is a cross-sectional schematic of the fin-type field effect transistor of the fifth embodiment of the invention shown with reference to line II-II in FIG. 1.

FIG. 7 is a cross-sectional schematic of the fin-type field effect transistor of the fifth embodiment of the invention shown with reference to line II-II in FIG. 1. Referring to FIG. 7, the difference between a fin-type field effect transistor 70 and the fin-type field effect transistor 20 is: in the fin-type field effect transistor 70, the O-barrier layer 212 is located on the top surface and the sidewalls of the gate electrode 210. In the present embodiment, the forming method of the O-barrier layer 212 includes, for instance, performing a patterning process to define the gate electrode 210 after the gate electrode material layer is formed (as shown in FIG. 2C and FIG. 3C), and then performing the deposition and the patterning process of the O-barrier material layer, so as to form the O-barrier layer 212 on the top surface and the sidewalls of the gate electrode 210. Of course, in other embodiments, the O-barrier layer 212 can also be located on the top surface and the sidewalls of the gate electrode 210.

Figure 8:
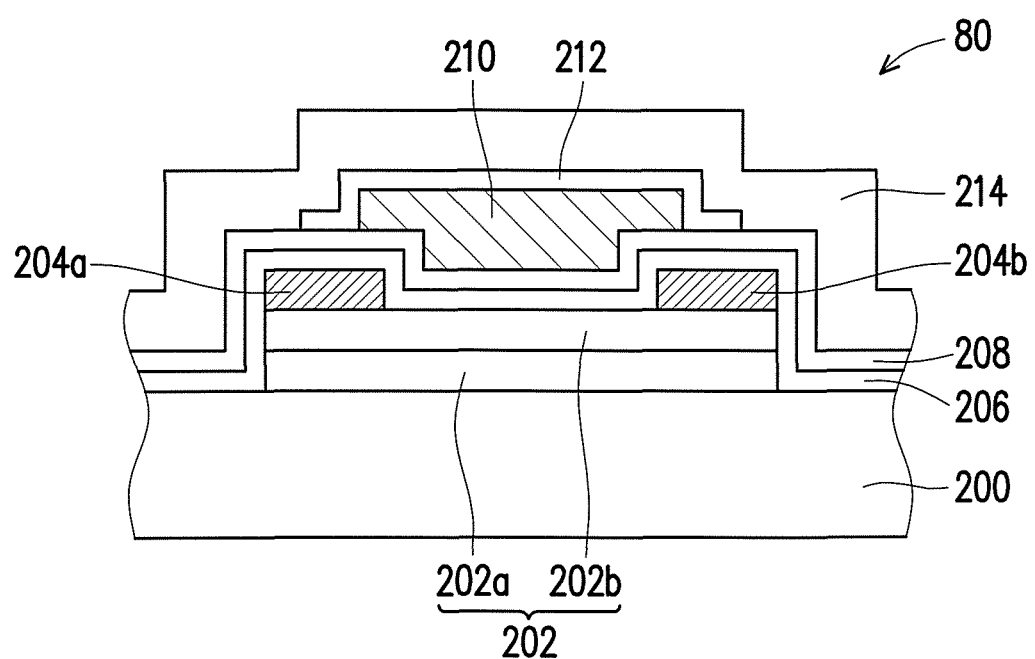
FIG. 8 is a cross-sectional schematic of the fin-type field effect transistor of the sixth embodiment of the invention shown with reference to line II-II in FIG. 1.

FIG. 8 is a cross-sectional schematic of the fin-type field effect transistor of the sixth embodiment of the invention shown with reference to line II-II in FIG. 1. Referring to FIG. 8, the difference between a fin-type field effect transistor 80 and the fin-type field effect transistor 70 is: in the fin-type field effect transistor 80, in addition to being located on the top surface and the sidewalls of the gate electrode 210, the O-barrier layer 212 is also extended on the surface of the O-barrier layer 208. In the present embodiment, the forming method of the O-barrier layer 212 is similar to that of FIG. 7, and after the gate electrode material layer is formed (as shown in FIG. 2C and FIG. 3C), a patterning process is performed to define the gate electrode 210, and then the deposition and the patterning process of the O-barrier material layer are performed. The difference between the present embodiment and FIG. 7 is that, when the patterning process is performed on the O-barrier material layer, a portion of the O-barrier material layer located on the surface of the O-barrier layer 208 is kept. Similarly, the same O-barrier layer 212 of the present embodiment can also be formed in other embodiments.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A semiconductor device, comprising:
   an oxide semiconductor protrusion disposed on an oxide substrate;
   a source and a drain respectively disposed on opposite ends of the oxide semiconductor protrusion;
   an oxide semiconductor layer disposed on the oxide substrate and covering the oxide semiconductor protrusion, the source, and the drain;
   a first O-barrier layer disposed on the oxide semiconductor layer;
   a gate electrode disposed on the first O-barrier layer and across the oxide semiconductor protrusion;
   a second O-barrier layer disposed on the gate electrode;
   an H-barrier layer disposed on the oxide substrate and covering the second O-barrier layer;
   a hard mask layer disposed on a top surface of the second O-barrier layer; and
   spacers, wherein the spacers are disposed on the first O-barrier layer and located on sidewalls of the gate electrode,
   wherein the source and the drain are only located on a top surface of the oxide semiconductor protrusion.

2. The semiconductor device of claim 1, wherein a material of the first O-barrier layer comprises hafnium oxide.

3. The semiconductor device of claim 1, wherein a material of the second O-barrier layer comprises hafnium oxide.

4. The semiconductor device of claim 1, wherein a material of the H-barrier layer comprises aluminum oxide.

5. The semiconductor device of claim 1, wherein the oxide semiconductor protrusion comprises a first oxide semiconductor layer and a second oxide semiconductor layer stacked on each other.

6. The semiconductor device of claim 1, wherein the second O-barrier layer is only located on a top surface of the gate electrode.

7. The semiconductor device of claim 1, wherein the second O-barrier layer is located on a top surface and sidewalls of the gate electrode.

8. A manufacturing method of a semiconductor device, comprising:
   forming an oxide semiconductor protrusion on an oxide substrate;
   respectively forming a source and a drain on opposite ends of the oxide semiconductor protrusion;
   forming an oxide semiconductor layer on the oxide substrate, wherein the oxide semiconductor layer covers the oxide semiconductor protrusion, the source, and the drain;
   forming a first O-barrier layer on the oxide semiconductor layer;
   forming a gate electrode on the first O-barrier layer, wherein the gate electrode is across the oxide semiconductor protrusion;
   forming a second O-barrier layer on the gate electrode;
   forming a hard mask layer on a top surface of the second O-barrier layer;
   forming spacers on the first O-barrier layer, wherein the spacers are located on sidewalls of the gate electrode; and
   forming an H-barrier layer on the oxide substrate,
   wherein the source and the drain are only located on a top surface of the oxide semiconductor protrusion.

9. The method of claim 8, wherein a material of the first O-barrier layer comprises hafnium oxide.

10. The method of claim 8, wherein a material of the second O-barrier layer comprises hafnium oxide.

11. The method of claim 8, wherein the second O-barrier layer is only located on a top surface of the gate electrode.

12. The method of claim 8, wherein the second O-barrier layer is located on a top surface and sidewalls of the gate electrode.

* * * * *